(12) United States Patent
Kondo

(10) Patent No.: US 6,779,157 B2
(45) Date of Patent: Aug. 17, 2004

(54) SEMICONDUCTOR INTEGRATED CIRCUIT MANUFACTURING METHOD AND MODEL PARAMETER EXTRACTING METHOD, APPARATUS, AND PROGRAM

(75) Inventor: Masaki Kondo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 10/096,671

(22) Filed: Mar. 14, 2002

(65) Prior Publication Data

US 2002/0133785 A1 Sep. 19, 2002

(30) Foreign Application Priority Data

Mar. 15, 2001 (JP) .................................... P2001-074782

(51) Int. Cl.[7] .............................................. G06F 17/50
(52) U.S. Cl. ............................................ 716/2; 703/13
(58) Field of Search ........................ 716/2, 1; 703/13, 703/14

(56) References Cited

U.S. PATENT DOCUMENTS 5,825,673 A * 10/1998 Watanabe .................... 703/14

2001/0007143 A1 * 7/2001 Wakita et al. ................. 716/4

OTHER PUBLICATIONS

James C. Chen, et al., "E–T Based Statistical Modeling and Compact Statistical Circuit Simulation Methodologies", Procedures of IEDM, 1996, pp. 635–638.

Yuhua Cheng, et al., "Parameter Extraction", BSIM3v3 Manual, Chapter 6, Department of Electrical Engineering and Computer Sciences, UC Berkeley, 1995, 1996, pp. 6–1 to 6–6.

* cited by examiner

*Primary Examiner*—Stacy A. Whitmore
(74) *Attorney, Agent, or Firm*—Oblon, Spivak, McClelland, Maier & Neustadt, P.C.

(57) ABSTRACT

A parameter extracting apparatus extracts the parameters of a circuit element model that represents a semiconductor element used for a circuit simulation. The apparatus has a specifying unit configured to specify an element structure and a physical model in the semiconductor element; a simulation unit configured to carry out local process and device simulations for parameters related to the specified element structure and physical model and calculate electric characteristics of the specified element structure; and a classification unit configured to classify the calculated electric characteristics according to bias conditions and element dimensions used in the simulations.

15 Claims, 8 Drawing Sheets

SEMICONDUCTOR INTEGRATED CIRCUIT MANUFACTURING METHOD AND MODEL PARAMETER EXTRACTING METHOD, APPARATUS, AND PROGRAM

CROSS REFERENCE TO RELATED APPLICATIONS

This application is based upon and claims the benefit of priority from the prior Japanese Patent Application No. 2001-074782 filed on Mar. 15, 2000, the entire contents of which are incorporated herein by reference.

BACKGROUND OF THE INVENTION

1. Field of the Invention

The present invention relates to a method of manufacturing a semiconductor integrated circuit and a technique of extracting parameters of a circuit element model used for a circuit simulation in designing a semiconductor integrated circuit.

2. Description of the Related Art

Semiconductor integrated circuits, in particular, LSIs such as high-frequency analog circuits, analog-digital circuits, and high-speed digital circuits involve fine patterns made by, for example, photolithography on semiconductor substrates. Testing these circuits requires a lot of time and money if they must actually be produced for the testing. To minimize testing time and cost, simulations are carried out to confirm the physical and electrical behaviors of the circuits and the circuit elements employed in the circuits before manufacturing. Simulations involved in the designing and development of a semiconductor integrated circuit include a process simulation to simulate the manufacturing processes, impurity/defect profiles, and geometries of circuit elements (or the devices); a device simulation to simulate the device behaviors of the circuit elements; and a circuit simulation to simulate the circuit performance.

The process simulation is carried out based on the conditions of each process and finds the impurity distributions and structures of semiconductor elements formed by the process. Based on the data provided by the process simulation, the device simulation is carried out to find the device behaviors of the semiconductor devices. Based on the data provided by the process and device simulations, the circuit simulation is carried out to find the circuit performance, or the electric characteristics of the semiconductor integrated circuit.

The circuit simulation employs a circuit element model representing the electric characteristics of a semiconductor element of a target integrated circuit, and based on the circuit element model, calculates potential levels and current values to occur at nodes of the integrated circuit. The circuit element model consists of numerical expressions representing the operation principles of the element and parameter values determined from manufacturing conditions. An operation to determine parameter values of a circuit element model according to electric characteristics measured on actual semiconductor elements is called "parameter extraction." Correctly carrying out parameter extraction is important to provide an accurate circuit element model and secure the reliability of a circuit simulation.

For example, parameter extraction of a circuit element model of, for example, a MOSFET frequently employs an optimization technique. The optimization technique employs a nonlinear optimization algorithm such as a Newton-Raphson method to determine parameter values of the circuit element model. The optimization technique is easily applied to any circuit element model. However, it has a disadvantage of involving local solutions of poor accuracy when handling many parameters. To overcome this disadvantage, a local optimization technique is employed to extract parameters of a circuit element model such as a BSIM3 model involving many parameters.

Parameter extraction according to a related art employing the local optimization technique will be explained with reference to FIG. 1.

Step S201 measures the electric characteristics of actual semiconductor elements according to various bias conditions and element dimensions. Step S202 classifies the measured electric characteristics according to the bias conditions and element dimensions. Step S203 selects sensitive parameters related to the classified electric characteristics. Step S204 carries out local optimization operations to narrow down and determine values of the selected parameters according to the classified electric characteristics. Step S205 checks to see if the determined parameter values can sufficiently reproduce the actually measured electric characteristics. If the determination in step S205 is affirmative, step S207 provides the determined parameter values as the parameter values of the circuit element model. If the determination in step S205 is negative, step S206 carries out a global optimization operation to determine parameter values. Instead of step S206, step S204 may again be carried out to determine parameter values.

Parameter extraction employing the local optimization technique will be explained in more detail with reference to a BSIM3 model.

The BSIM3 model expresses a MOSFET and includes parameters that are effective only when the channel length L of the MOSFET is short and the parameters are independent of the channel length L. For example, a partial expression P to calculate a threshold voltage of the MOSFET is as follows:

$$P = P_0 + P_1/L \quad (1)$$

where $P_0$ and $P_1$ are parameters. If the channel length L of the MOSFET is sufficiently larger than the parameter $P_1$, the influence of $P_1$ is small and P is nearly equal to $P_0$. In this case, electric characteristics actually measured on MOSFETs having sufficiently long channel lengths are effective in narrowing down the parameter $P_0$. Thereafter, the parameter $P_1$ is narrowed down from electric characteristics actually measured on MOSFETs having short channel lengths.

In this way, the parameter extraction employing the local optimization technique considers only a small number of sensitive parameters in each step, thus overcoming the disadvantage of the nonlinear optimization algorithm.

It is ideal for the local optimization technique that the sensitivity of any parameter that is not extracted in a given step and is to be extracted later is reduced to zero, realizing a perfectly localized state in the given step. In practice, however, it is difficult to realize a perfectly localized state. In the above example, a value of the parameter $P_0$ extracted first will greatly deviate from a true value depending on the value of the parameter $P_1$ extracted later, even if the channel length L is greatly extended.

As a result, each parameter extraction step of the local optimization technique involves calculation noise caused by parameters that are not determined in the step. Such calculation noise accumulates, enlarging the error step by step, and gradually deteriorating the accuracy of the parameter values determined. In the above example, absorbing error in the parameter $P_0$ using a parameter $P_1$ with short channel lengths increases errors with respect to large channel lengths.

Parameter extraction employing the local optimization technique, therefore, frequently requires global optimization and repetitive calculations.

Global optimization and repetitive calculations usually involve solution divergence and poor local solutions, and therefore, are incapable of correctly extracting parameters of a circuit element model or securing unique parameter values. FIG. 2 is a graph showing a drain voltage vs drain current characteristic of a MOSFET involving such inaccurate solutions. This graph shows that electric characteristics provided by a circuit simulation based on inaccurate local solutions greatly deviate from actually measured electric characteristics.

Extraction accuracy of the parameters of a circuit element model seriously influences the semiconductor development stage of determining manufacturing conditions and designing a circuit. To reduce the cost and time of product development and improve the efficiency thereof, it is necessary to provide a technique of correctly extracting parameters of a circuit element model.

SUMMARY OF THE INVENTION

According to a first aspect of the present invention, an apparatus for extracting parameters of a circuit element model that represents a semiconductor element used for a circuit simulation has a specifying unit configured to specify an element structure and a physical model in the semiconductor element; a simulation unit configured to carry out local process and device simulations for parameters related to the specified element structure and physical model and calculate separately electric characteristics of the specified element structures respectively; and a classification unit configured to classify the calculated electric characteristics according to bias conditions and element dimensions used in the local process and device simulations.

According to a second aspect of the present invention, a circuit designing system has a calculating unit for carrying out local process and device simulations for parameters related to an element structure and a physical model, the element structures and physical models being specified in a semiconductor element; for calculating separately electric characteristics of the specified element structures; and for classifying the calculated electric characteristics according to bias conditions and element dimensions used in the local process and device simulations.

According to a third aspect of the present invention, a method of extracting parameters of a circuit element model, the circuit element model representing a semiconductor element used for a circuit simulation, includes a) carrying out local process and device simulations for parameters related to an element structure and a physical model in order to calculate separately electric characteristics of the element structures, the element structure and physical model being specified in the semiconductor element; b) classifying the calculated electric characteristics according to bias conditions and element dimensions used in the local process and device simulations; and c) determining values of the parameters of the circuit element model in a step-by-step manner according to the classified electric characteristics serving as targets.

According to a fourth aspect of the present invention, a method of manufacturing a semiconductor integrated circuit includes a) carrying out a rough process simulation for a semiconductor element to be included in the semiconductor integrated circuit, in order to provide process conditions and element structures of the semiconductor element; b) carrying out a rough device simulation according to the provided process conditions and element structures, in order to provide rough electric characteristics of the semiconductor element; c) specifying elements structures and physical models in the semiconductor elements; d) carrying out local process and device simulations for parameters relating to the specified element structures and physical models to calculate electric characteristics of the specified element structures; e) determining parameter the values of a circuit element model representing the semiconductor element in a step-by-step manner; f) carrying out a circuit simulation according to the determined parameter value so as to provide circuit performance, and g) evaluating the circuit performance.

According to a sixth aspect of the present invention, a computer executable program for extracting parameters used for a circuit simulation includes a) specifying an element structure and a physical model in the semiconductor element; b) carrying out local process and device simulations for parameters related to the specified element structure and physical model in order to calculate separately electric characteristics of the specified element structure; c) classifying the calculated electric characteristics according to bias conditions and element dimensions used in the local process and device simulations; d) determining values of the parameters of the circuit element model in a step-by-step manner according to the classified electric characteristics serving as targets; e) extracting physical quantities of the semiconductor element according to the results of the local process and device simulations; f) calculating initial values of the parameters of the circuit element model according to the extracted physical quantities; and g) determining whether or not the element structures and physical models on which the electric characteristics have been calculated wholly cover the semiconductor element.

DETAILED DESCRIPTION OF EMBODIMENTS

The present invention is applicable to extracting the parameters of, for example, a semiconductor circuit element model.

The structure and operation of a parameter extracting apparatus according to an embodiment of the present invention will be explained. In the embodiment, the apparatus extracts parameters of a circuit element model used for a circuit simulation.

Circuit Designing System

Figure 1:
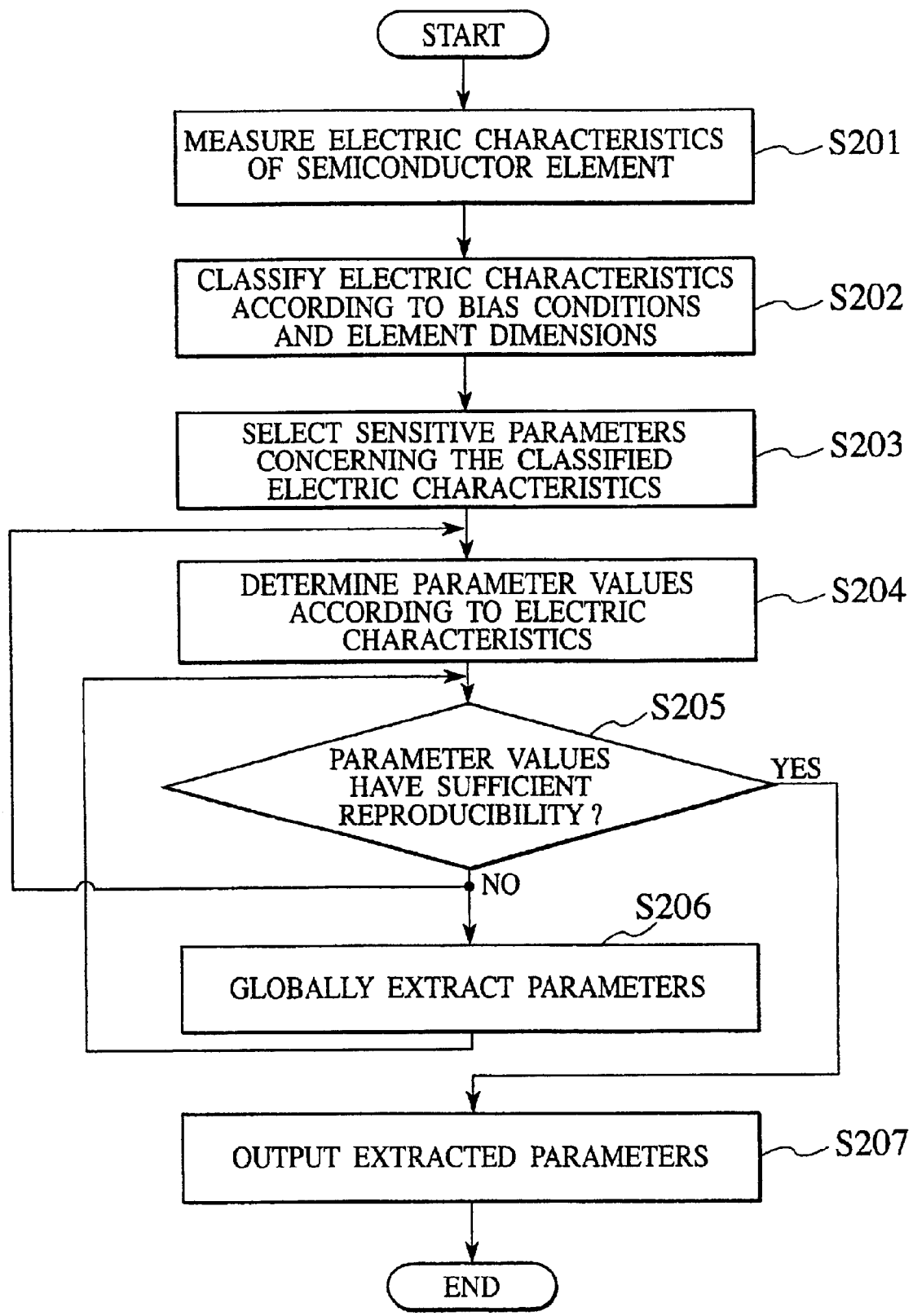
FIG. 1 is a flowchart showing a parameter extracting operation according to a related art.
Figure 2:
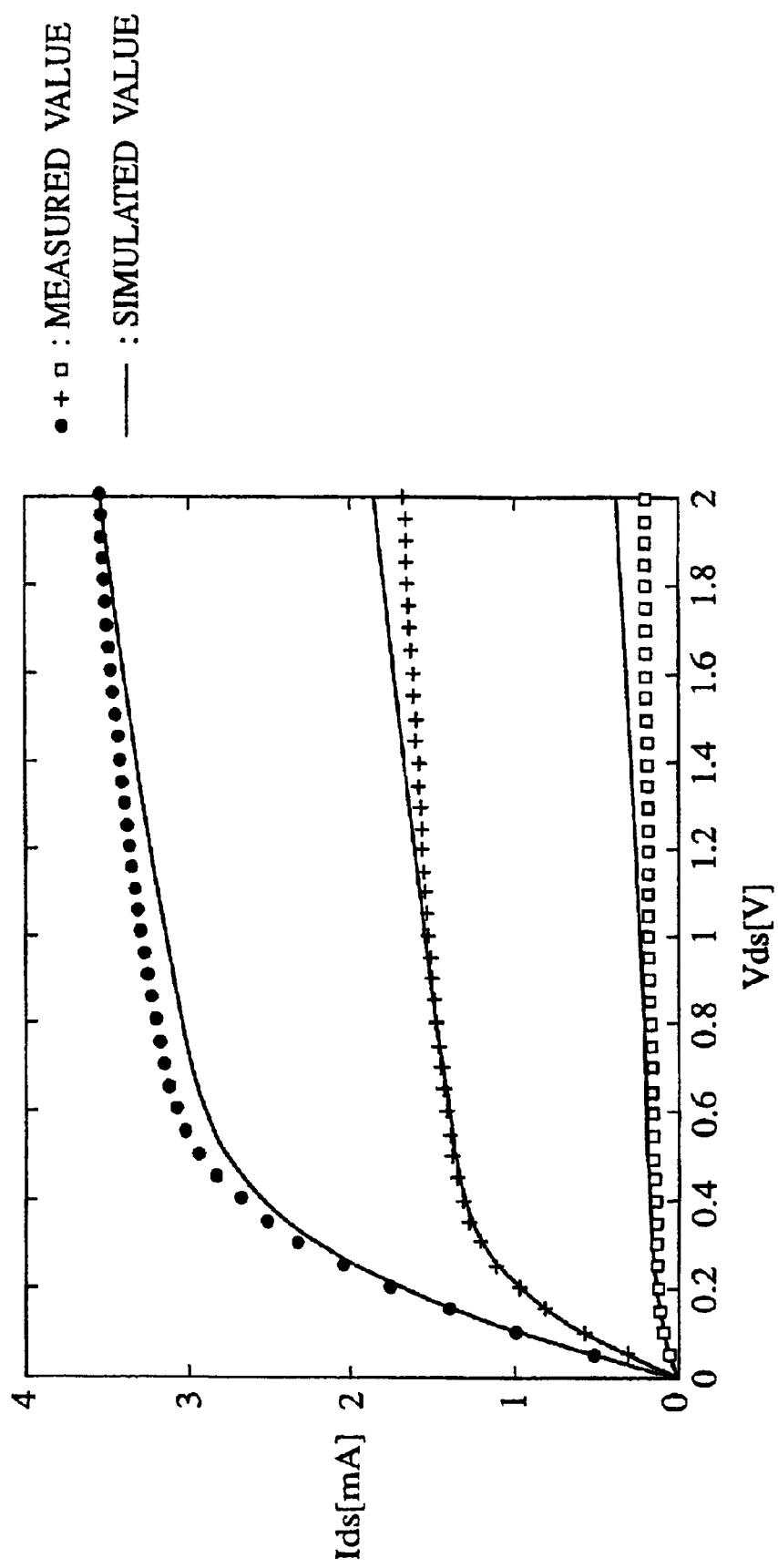
FIG. 2 shows a simulation result of a MOSFET according to the related art.
Figure 3:
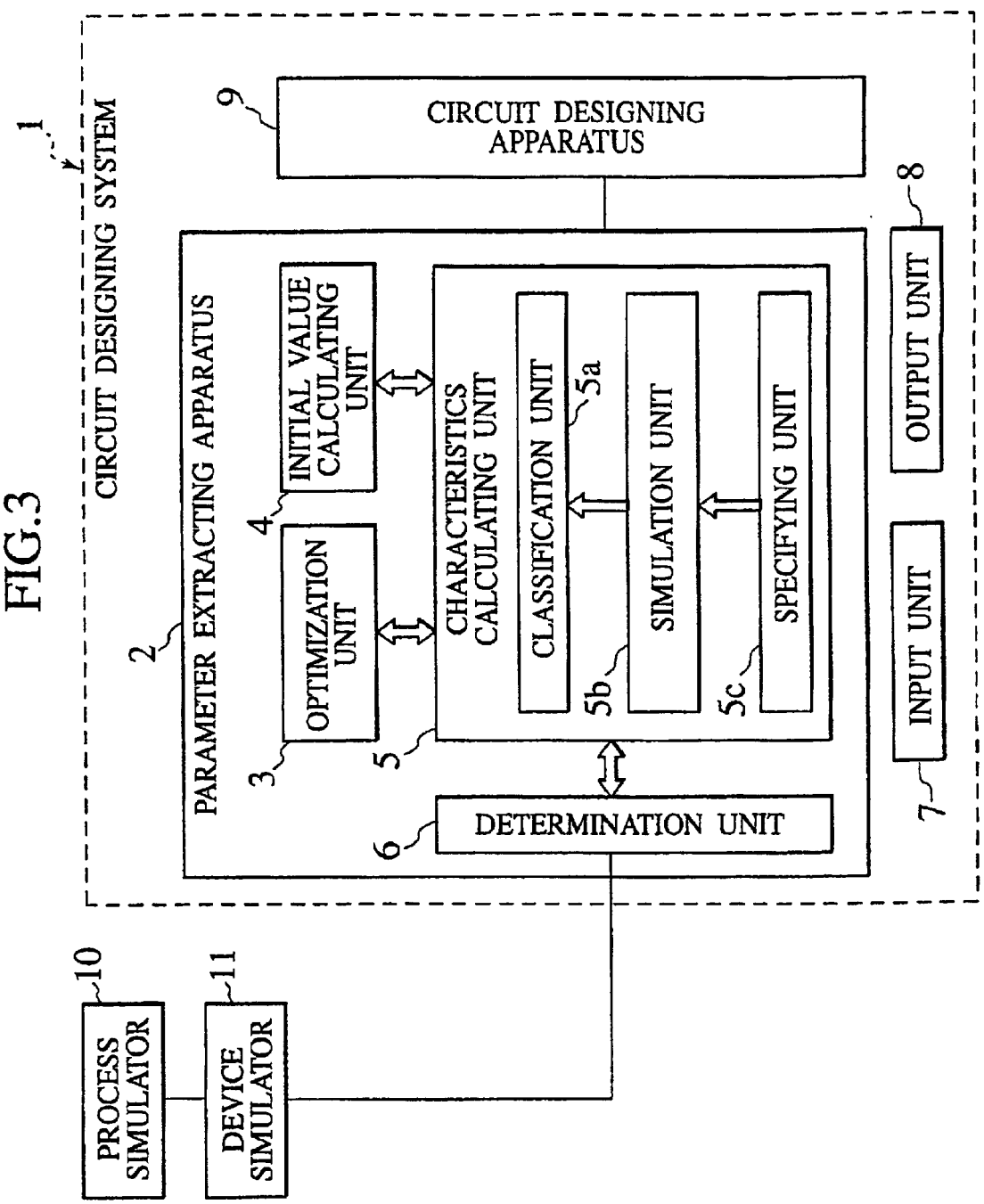
FIG. 3 shows a parameter extracting apparatus according to an embodiment of the present invention.

FIG. 3 shows a circuit designing system 1 according to an embodiment of the present invention. The circuit designing system 1 embraces a parameter extracting apparatus 2 and a circuit designing apparatus 9 connected to the parameter extracting apparatus. The circuit designing apparatus 9 uses parameters provided by the parameter extracting apparatus 2 to execute a circuit designing operation, including a circuit simulation of a semiconductor integrated circuit. The circuit designing system 1 is connected to a device simulator 11, to use simulation results from the simulator 11. The device simulator 11 is connected to a process simulator 10, configured such that the simulation results issued from the process simulator 10 can be communicated to the device simulator 11. Simulations carried out by the simulators 10 and 11 are rough process/device simulations that mainly relate to the structure of a semiconductor element employed in the semiconductor integrated circuit.

The parameter extracting apparatus 2 has an optimization unit 3, an initial value calculating unit 4, a characteristics calculating unit 5, and a determination unit 6. The characteristics calculating unit 5 has a classification unit 5a, a simulation unit 5b, and a specifying unit 5c.

The optimization unit 3 receives electric characteristics, uses the received electric characteristics as targets, and determines parameter values of a circuit element model in a step-by-step manner. The "circuit element model" represents the semiconductor element scheduled to be employed in the semiconductor integrated circuit. The initial value calculating unit 4 receives results of rough process/device simulations from the process simulator 10 and device simulator 11, extracts physical quantities of the semiconductor element from the simulation results, and calculates initial parameter values of the circuit element model according to the extracted physical quantities.

The classification unit 5a of the characteristics calculation unit 5 receives data associated with the electric characteristics from the simulation unit 5b and classifies the received electric characteristics according to bias conditions and element dimensions used in local process/device simulations executed by the simulation unit 5b.

The simulation unit 5b receives data associated with specified element structures and specified physical models from the specifying unit 5c, carries out local process/device simulations for the received element structure and physical model, and provides the data associated with the electric characteristics of the element structure. The specifying unit 5c specifies element structures and physical models that are used by the simulation unit 5b when carrying out local process/device simulations.

The determination unit 6 determines whether or not the electric characteristics calculated by the simulation unit 5b covers all of the element structures and physical models associated with whole the semiconductor element.

The circuit designing system further encompasses an input unit 7 and an output unit 8. The input unit 7 is used to enter data concerning a parameter extracting operation. The input unit 7 may be a numeric keypad, a keyboard, a mouse, and the like. The output unit 8 is used to output data concerning a parameter extracting operation. The output unit 8 may be a display, a printer, and the like.

Operation of Parameters Extracting Apparatus

The operation of the parameter extracting apparatus 2 according to an embodiment of the present invention will be explained with reference to FIG. 4. The user of the parameter extracting apparatus 2 manipulates the input unit 7 and enters results of rough process/device simulations. These results mainly relate to the structure of the semiconductor element represented by the circuit element model whose parameters are going to be extracted. The user enters an instruction to start the parameter extracting operation in the apparatus 2 through the input unit 7. In this embodiment, the user enters the results of rough process/device simulations of the semiconductor element. This does not limit the present invention. For example, the user may enter data on the processing conditions and structure of the semiconductor element, and the simulation unit 5b may carry out local process/device simulations of the semiconductor element according to the entered data and provide results of the local simulations.

Figure 4:
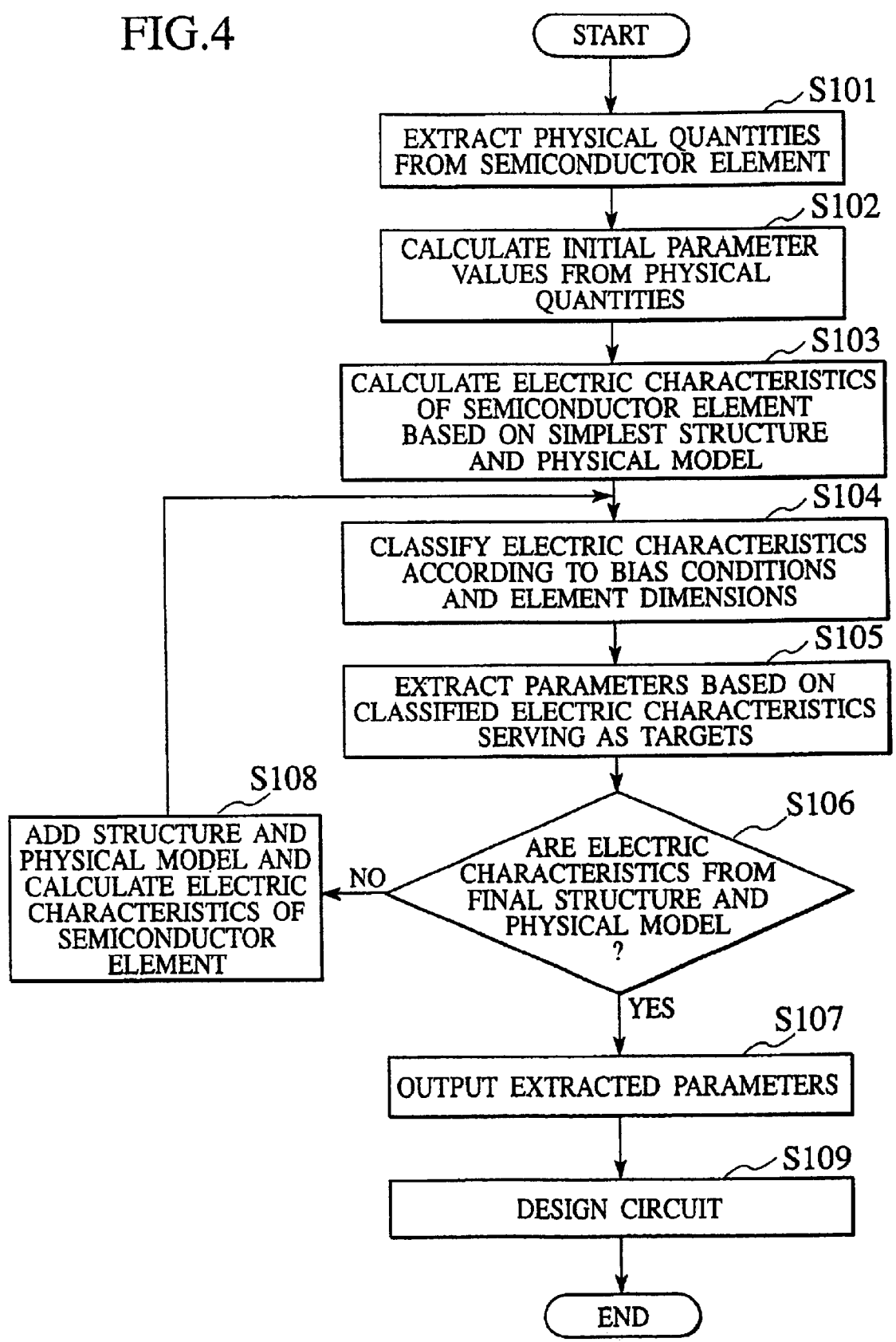
FIG. 4 is a flowchart showing a parameter extracting operation carried out with the apparatus of FIG. 3 according to an embodiment of the present invention.

(a) In step S101 of FIG. 4, the initial value calculating unit 4 extracts physical quantities of the semiconductor element from the rough process/device simulation results, and in step S102, calculates the initial parameter values of a circuit element model representing the semiconductor element. The parameters whose initial values are calculated in step S102 may be those related to film thickness, junction depth, and impurity concentration of the semiconductor element.

(b) The specifying unit 5c refers to the entered rough process/device simulation results and specifies, or separates regions or element structures in the semiconductor element that includes no parasitic factors such as parasitic resistances and capacitances. At the same time, the specifying unit 5c specifies physical models necessary to carry out local device simulation of the semiconductor element. The specified regions (element structures) and physical model are supplied to the simulation unit 5b. If the semiconductor element is a MOSFET, one of the specified regions (specified element structures) separated by the specifying unit 5c will be, for example, a channel region that includes no parasitic resistance and capacitance, and the physical model will be, for example, only a mobility model (other models such as an impact ionization model and a gate polysilicon depletion model are excluded). The regions and physical model specified by the specifying unit 5c differ depending on the circuit element model whose parameters are to be extracted.

(c) In step S103, the simulation unit 5b receives the regions (element structures) and physical model specified by the specifying unit 5c, carries out local process/device simulations according to the received data, and calculates electric characteristics of the element structures. The calculated data of the electric characteristics are transferred to the classification unit 5a. In step S104, the classification unit 5a classifies the data of the electric characteristics according to bias conditions and element dimensions used in the local process/device simulations and transfers the classified data of the electric characteristics to the optimization unit 3.

(d) In step S105, the optimization unit 3 receives the data of the electric characteristics, uses them as targets for narrowing down and determining the parameter values of the circuit element model in a step-by-step manner. The parameter values determined in step S105 relate to difference between currently inputted and previously inputted electric characteristic calculation conditions. If the data of the electric characteristics received by the optimization unit 3 relate to a newly added physical model concerning impact ionization, the parameter values determined in step S105 relate only to the impact ionization. The first time step S105 is carried out, all parameter values concerning the element structures and physical models specified by the specifying unit 5c can be determined. The parameter values may be determined according to a nonlinear algorithm or an analytic parameter calculation.

(e) In step S106, the determination unit 6 determines whether or not the electric characteristics calculated in step S105 covers all of the element structures and physical models of the semiconductor element. If they entirely cover the semiconductor element, step S107 provides the determined parameter values. Thereafter, the user uses the parameter values as the parameter values of the circuit element model to execute a circuit simulation, and in step S109, employs the circuit designing apparatus 9 to design a semiconductor integrated circuit according to the results of the circuit simulation. The data of the designed semiconductor integrated circuit is then communicated to a pattern generator for generating a set of masks so that the semiconductor integrated circuit can be manufactured with the set of masks.

(f) If the determination unit 6 determines in step S106 that the electric characteristics used in step S105 do not wholly cover the semiconductor element, the specifying unit 5c expands the element structures and physical models by adding a remaining element structure and a remaining physical model of the semiconductor element to the present element structures and physical models and provides the expanded element structures and physical models to the simulation unit 5b. In step S108, the simulation unit 5b calculates the electric characteristics of the expanded element structures according to the expanded element structures and physical models. Thereafter, step S104 and steps that follow are repeated. The loop circulating steps S104, S105, S106, and S108 is repeated until the electric characteristics are calculated to completely provide all parameters of the circuit element model.

Although the above embodiment expands both the element structures and physical models, it is possible to expand at least one of the element structures and physical models. It is also possible to change the element structures and physical models instead of expanding them. This is effective for, in particular, the physical models.

EXAMPLE

Figure 5:
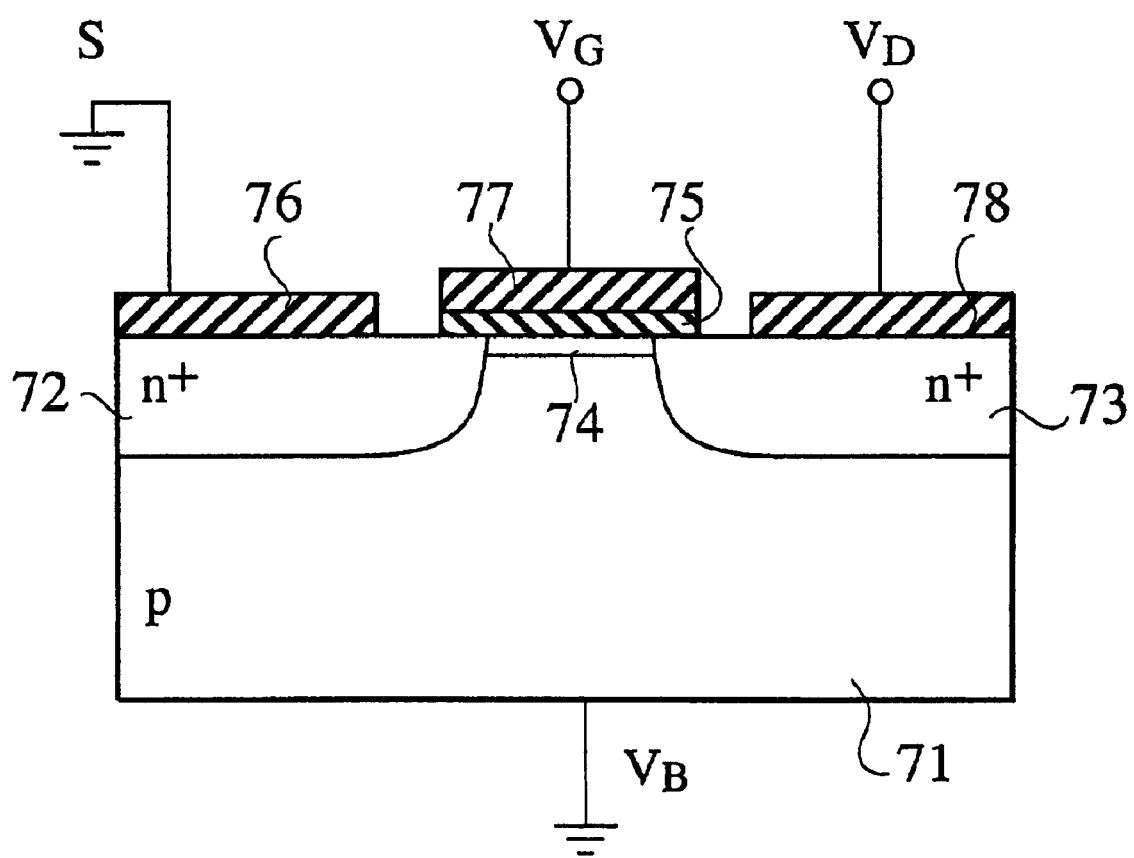
FIG. 5 shows a basic structure of a MOSFET.

The parameter extracting technique of the present invention will be explained in more detail with reference to an experimental example. The example extracts parameters of a BSIM3v3 model representing a MOSFET. An example of configuration of the MOSFET is shown in FIG. 5.

The MOSFET encompassing, for example a p type substrate 71, and an n$^+$ source region 72 and an n$^+$ drain region 73 disposed at a surface of and in the p type substrate 71. A metallic source electrode 76 and a metallic drain electrode 78 are contacted to the surface of the n+ source region 72 and the n$^+$ drain region 73, respectively. An gate oxide film 75 is formed on the surface of the p substrate 71 between the n$^+$ source region 72 and the n+ drain region 73, and the gate electrode 77 is disposed on the gate oxide film 75. A channel region 74 is defined between the n$^+$ source region 72 and the n$^+$ drain region 73 serving as a path of the main current which flows from the n$^+$ source region 72 to the n$^+$ drain region 73.

The BSIM3v3 model employs an expression (2) to express the basic current-voltage characteristics of the MOSFET.

$$I_{DS} = f(V_{DS}, V_{GS}, V_{BS}, R_{DS}, I_{SUB}, N_{POLY}, \ldots) \tag{2}$$

where $V_{DS}$, $V_{GS}$, $V_{BS}$, $R_{DS}$, $I_{SUB}$, and $N_{POLY}$ are drain voltage applied to the drain electrode 78, gate voltage applied to the gate electrode 77, substrate voltage of the substrate 71, parasitic resistance parameter in the substrate 71, substrate current parameter in the substrate 71, and depletion effect parameter in the substrate 71 or gate electrode 77, respectively. These parameters relate to miniaturization effects of the MOSFET, such as source-drain parasitic resistance, substrate current due to impact ionization, and depletion of gate polysilicon electrode 77.

The parameters of the expression (2) are included in a substrate expression of the BSIM3v3 model and are individually calculated from specific expressions and parameters. Separation of the basic characteristics, parasitic resistance, substrate current, and depletion effect of the MOSFET will be explained.

To separate the parasitic resistance, a channel region 74 excluding source region 72 and drain region 73 is separated from the structure of the MOSFET. To separate the substrate current, a physical model related to the impact ionization is excluded. To separate the depletion effect, a structure with whole gate polysilicon 77 serving as an electrode is specified. To calculate the basic characteristics without the miniaturization effects, physical models related to the horizontal and vertical electric field dependence of mobility are excluded.

The parameter extracting operation according to the present invention uses the calculated basic characteristics to narrow down parameters relating to threshold voltage and mobility and parameters relating to saturated regions, i.e., parameters relating to channel length variations, DIBL, and impurities. At this time, parameters relating to the thickness of the gate oxide film 75 and the surface concentration of the substrate 71 in the MOSFET employ initial values provided by a rough process simulation.

Figure 6:
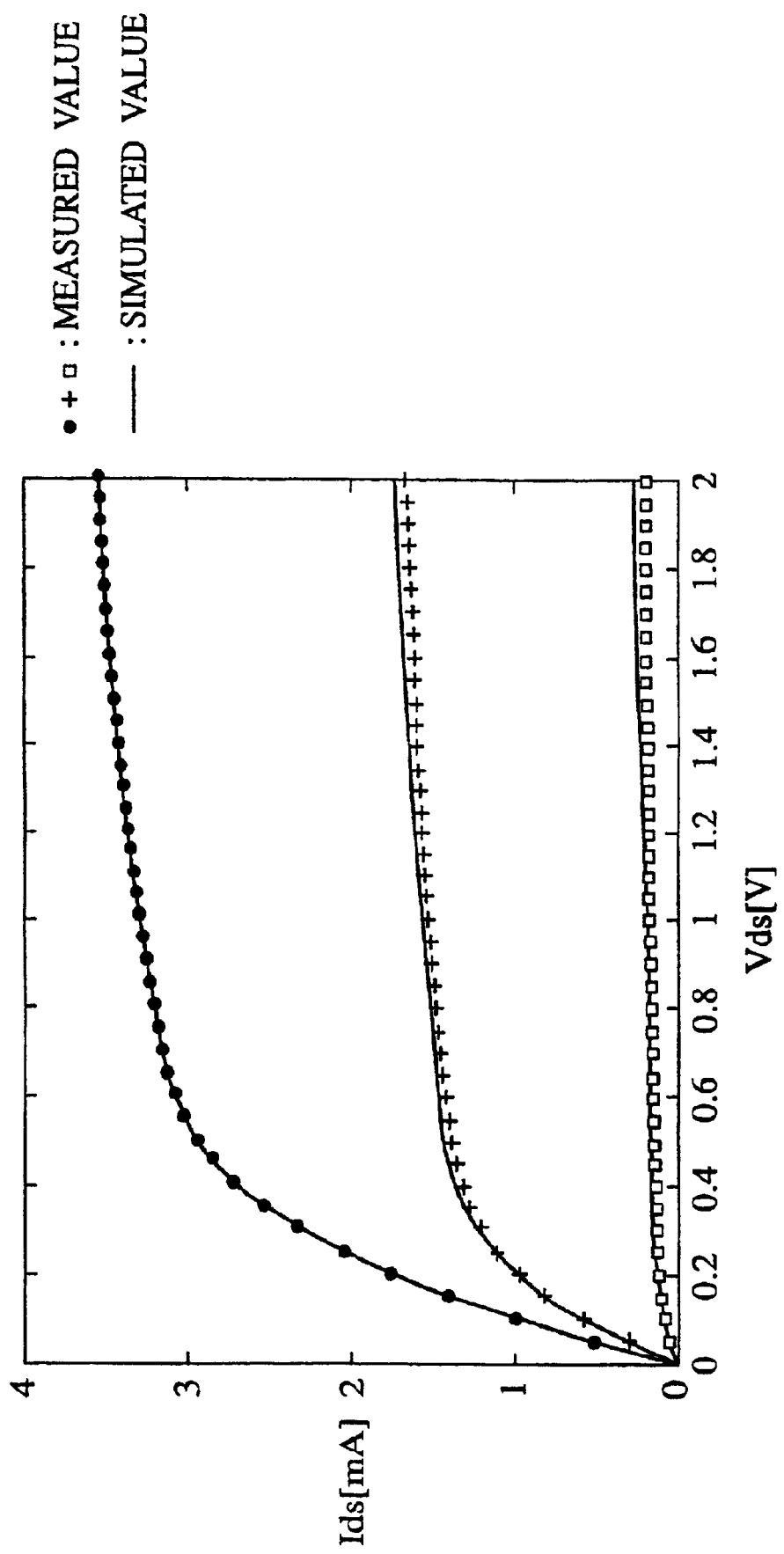
FIG. 6 shows a simulation result of a MOSFET according to an embodiment of the present invention.

Thereafter, current-voltage characteristics are calculated in consideration of the horizontal and vertical electric field dependence of mobility, and corresponding parameters are narrowed down. Then, the substrate current, depletion, and parasitic resistance are successively taken into account to calculate current-voltage characteristics. At the same time, corresponding parameters are successively narrowed down. As a result, parameter values that correctly reproduce measured values are provided as shown in FIG. 6.

In this way, the parameter extracting apparatus 2 of the embodiment calculates the electric characteristics of a semiconductor element in a step-by-step manner starting from simplest structural and physical forms and uses the electric characteristics as targets to determine parameter values step by step. The embodiment eliminates the influence of parasitic factors and secondary physical phenomena and extracts parameters in a perfectly localized state that is unrealizable by the related art. The embodiment removes the influence of noise in an initial stage of parameter extraction and extracts correct and unique parameters of a circuit element model.

Method of Manufacturing Semiconductor Integrated Circuit

A method of manufacturing a semiconductor integrated circuit according to an embodiment of the present invention will be explained.

Figure 7:
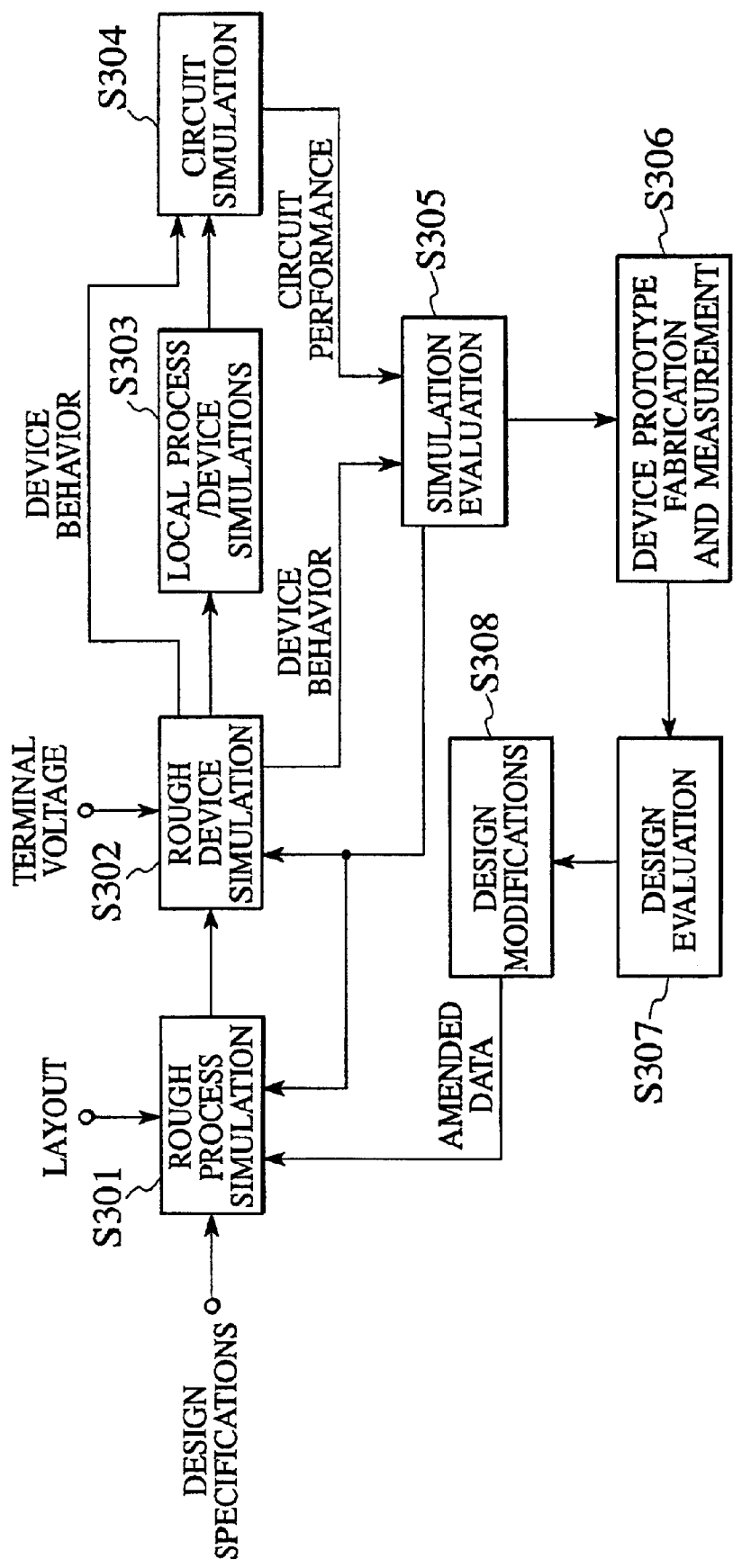
FIG. 7 shows a method of manufacturing a semiconductor integrated circuit according to an embodiment of the present invention.

The parameter extracting apparatus according to an embodiment of the present invention calculates the electric characteristics of the semiconductor element in a step-by-step manner starting from the physically and structurally simplest conditions and uses the electric characteristics as targets in each step to locally determine the parameter values of the circuit element model representing the semiconductor element. The parameter values of the circuit element model thus provided are free from the influence of noise caused in an initial stage of parameter extraction, accurate and unique. FIG. 7 shows a method of manufacturing a semiconductor integrated circuit that uses the parameter values provided by the parameter extracting apparatus according to an embodiment of the present invention. In FIG. 7, the parameter values provided by the parameter extracting apparatus according to an embodiment of the present invention are used for a circuit simulation, and a result of the circuit simulation is used to manufacture the semiconductor integrated circuit. The semiconductor integrated circuit manufacturing method will be explained below in detail.

(a) Before extracting parameter values for simulating the semiconductor integrated circuit, step S301 of FIG. 7 carries out a rough process simulation of a semiconductor element (an active element) contained in the semiconductor target integrated circuit. The rough process simulation provides data on the processing conditions and structure of the semiconductor element. The data is supplied to a device simulator. The process simulation of step S301 determines structural parameters related to, for example, a twin well structure, a triple well structure, an SOI structure, a buried layer structure, and a trench structure in a semiconductor substrate.

(b) Step S302 carries out a rough device simulation according to the processing conditions and structure of the semiconductor element provided by the rough process simulation and input data relating to electric boundary conditions such as applied terminal voltages and the current values. The rough device simulation of step S302 provides rough electric characteristics such as current-voltage characteristics of the semiconductor element.

(c) Step S303 loads the device behaviors, or the electric characteristics of the semiconductor element provided by the rough device simulation of step S302 into the parameter extracting apparatus. The parameter extracting apparatus classifies the electric characteristics according to bias conditions and element dimensions used in the simulations. The parameter extracting flow of FIG. 4 is executed. The loaded electric characteristics are used as targets to repeat local process/device simulations to determine parameter values of the circuit element model representing the semiconductor element in a step-by-step manner. After determining the parameter values of the circuit element model, it is checked to see whether the electric characteristics wholly cover the element structures and physical models of the semiconductor element. If they wholly cover the element structures and physical models of the semiconductor element, the determined parameter values are supplied to a circuit simulator.

(d) In step S304, the circuit simulator uses the parameter values of the circuit element model provided by the parameter extracting apparatus to calculate the influence of, for example, substrate parasitic elements on wiring capacitance. Also, the circuit simulator carries out a circuit simulation according to the electric performances provided by the parameter extracting apparatus. The circuit simulation provides circuit characteristics including gate delays caused by the stray capacitance of substrate surface wiring and noise characteristics due to the gate delays.

(e) Step S305 evaluates the device behavior provided by the rough device simulation of step S302 and the circuit performance by the circuit simulation of step S304, and determines whether or not the semiconductor integrated circuit satisfies required electric characteristics and circuit characteristics.

(f) If step S305 determines that the semiconductor integrated circuit satisfies the required electric characteristics and circuit characteristics. If the determination in step s305 is affirmative, step S306 carries out, for example, a mask pattern generation process to prepare a set of masks (reticles) using such as the optional lithography system, the electron beam (EB) lithography system and X-ray lithography system. Further, step s306 starts a semiconductor manufacturing process using the set of masks in photolithography process. For example, step S306 carries out selective thermal diffusion or selective ion implantation with one of masks so that a surface of a semiconductor substrate is selectively doped with impurities. Thereafter, another photolithography process using another mask is carried out to prepare etching masks, and a dry etching process is carried out with the etching masks to delineate the semiconductor substrate to provide a specific geometry and thin films formed thereon. In addition, epitaxial growth, CVD, vacuum vapor deposition, and spattering may be carried out to form various required films. These processes are combined to form the required semiconductor integrated circuit. Also, step S306 measures the characteristics of the semiconductor integrated circuit thus produced. If step S305 determines that the semiconductor integrated circuit does not satisfy the required characteristics, it is determined that the proposed manufacturing processes are unsuitable for manufacture of the semiconductor integrated circuit. In this case, the manufacturing conditions and processes and order thereof are changed, and step S301 or S302 is repeated.

(g) Step S307 evaluates the characteristics of the semiconductor integrated circuit measured in step S306, checking whether the characteristics satisfy required specifications. If they do not satisfy the required specifications, the design of the semiconductor integrated circuit is modified in step S308 so that an amended data can be provided to step s301. And step S301 and steps that follow are repeated.

Program Stored in Storage Medium

The parameter extracting operation mentioned above may be described as a program, which is stored in a computer readable storage medium. When carrying out a simulation, the storage medium is read by a computer system and is loaded into a memory of the computer system, so that the program is executed by a processing unit of the computer system to achieve the parameter extracting operation. The computer readable storage medium for storage of the program may be a semiconductor memory, a magnetic disk, an optical disk, a magneto-optic disk, a magnetic tape, and the like.

Figure 8:
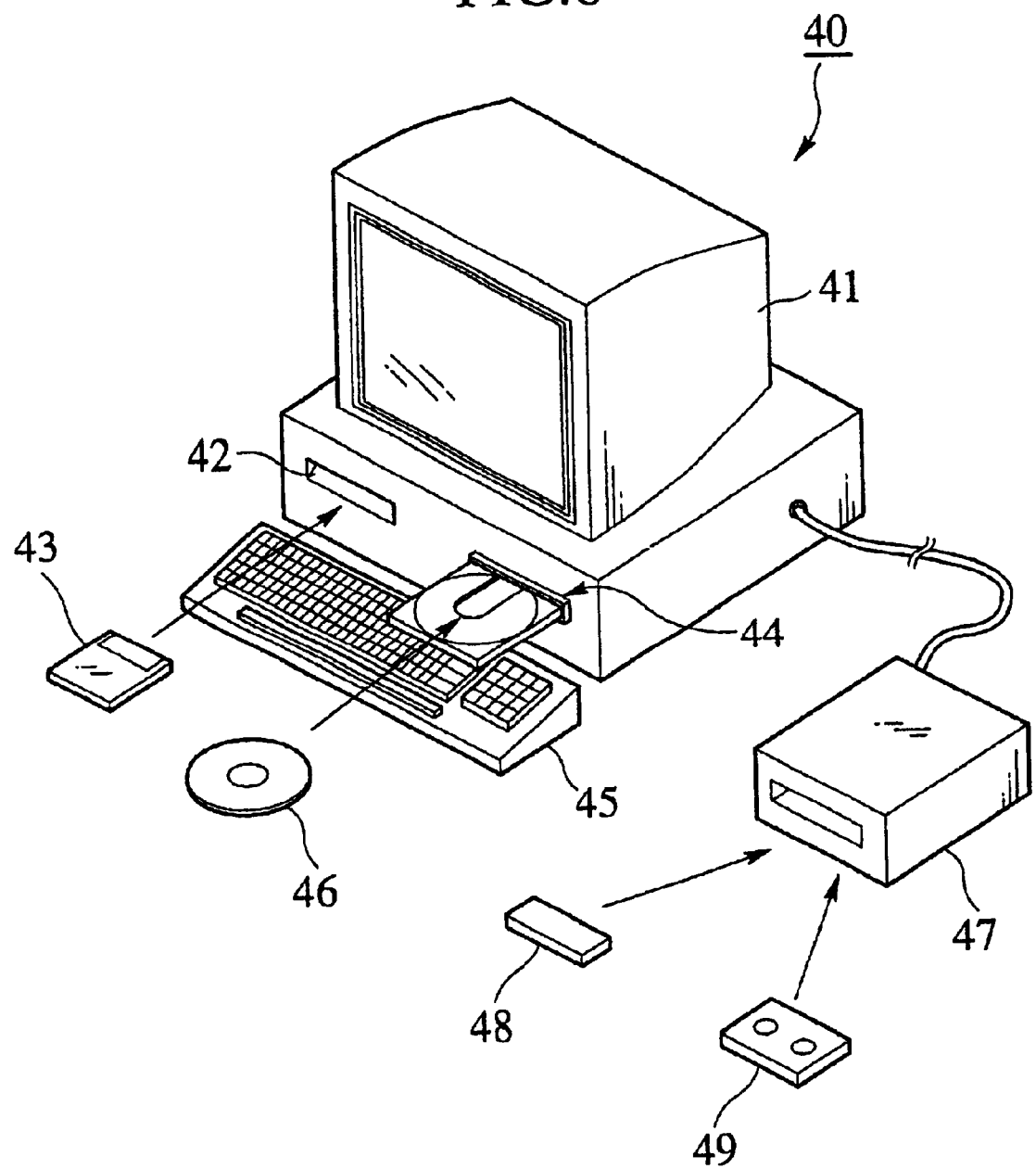
FIG. 8 shows a computer system employable to realize the apparatus.

FIG. 8 shows an example of such a computer system. The computer system 40 has a floppy disk drive 42 and an optical disk drive 44. The floppy disk drive 42 receives and reads a floppy disk 43, and the optical disk drive 44 receives and reads an optical disk 46, so that programs stored in the disks 43 and 46 are installed in the computer system 40. The computer system 40 may be connected to a drive 47 that handles, for example, a ROM 48 and a magnetic tape cartridge 49 to and from which data is written and read by the computer system 40. The computer system 40 has a keyboard 45 for entering data concerning parameter extraction and a display 41 for displaying output data from the computer system 40.

Other Embodiments

As stated above, the feature of the present invention eliminates the influence of noise in the initial stages of parameter extraction and extracts accurate and unique parameters of a semiconductor circuit element model.

The embodiments mentioned above must be considered in all respects as illustrative and not restrictive. Additional advantages and modifications of the present invention will readily occur to those skilled in the art.

The embodiments mentioned above carry out local process/device simulations when required to calculate electric characteristics and optimize parameter values. This does not limit the present invention. Electric characteristics necessary for providing optimum parameter values may collectively be calculated beforehand, and parameter values may collectively be optimized thereafter. Instead of carrying out local process/device simulations to provide the electric characteristics, electric characteristics actually measured on semiconductor elements may be used as target values. In this case, all or some of parameter values obtained as mentioned above may be used as initial parameter values.

The present invention may be embodied in other specific forms without departing from the spirit or essential characteristics hereof. The scope of the present invention is indicated by the appended claims rather than by the foregoing description.

What is claimed is:

1. An apparatus for extracting the parameters of a circuit element model, the circuit element model representing a semiconductor element used for a circuit simulation, comprising:
   a specifying unit configured to specify element structures and physical models in the semiconductor element;
   a simulation unit configured to carry out local process and device simulations for parameters related to the specified element structures and physical models and calculate separately electric characteristics of the specified element structures, respectively; and
   a classification unit configured to classify the calculated electric characteristics according to bias conditions and element dimensions used in the local process and device simulations.

2. The apparatus of claim 1, further comprising:
   an optimization unit configured to determine values of the parameters of the circuit element model in a step-by-step manner according to data of the electric characteristics serving as targets.

3. An apparatus for extracting the parameters of a circuit element model, the circuit element model representing a semiconductor element used for a circuit simulation, comprising:
   a specifying unit configured to specify element structures and physical models in the semiconductor element;
   a simulation unit configured to carry out local process and device simulations for parameters related to the specified element structures and physical models and calculate separately electric characteristics of the specified element structures, respectively;
   a classification unit configured to classify the calculated electric characteristics according to bias conditions and element dimensions used in the local process and device simulations;
   an optimization unit configured to determine values of the parameters of the circuit element model in a step-by-step manner according to data of the electric characteristics serving as targets; and
   an initial value calculating unit configured to extract physical quantities of the semiconductor element according to the results of the local process and device simulations and calculate initial values of the parameters of the circuit element model according to the extracted physical quantities.

4. The apparatus of claim 3, further comprising:
   a determination unit configured to determine whether or not the calculated electric characteristics cover all of the element structures and physical models of the semiconductor element.

5. An apparatus for extracting the parameters of a circuit element model, the circuit element model representing a semiconductor element used for a circuit simulation, comprising:
   a specifying unit configured to specify element structures and physical models in the semiconductor element;
   a simulation unit configured to carry out local process and device simulations for parameters related to the specified element structures and physical models and calculate separately electric characteristics of the specified element structures, respectively;
   a classification unit configured to classify the calculated electric characteristics according to bias conditions and element dimensions used in the local process and device simulations; and
   an optimization unit configured to determine values of the parameters of the circuit element model, said values of parameters relating to a difference between currently inputted and previously inputted electric characteristic calculation conditions in a step-by-step manner according to data of the electric characteristics serving as targets.

6. A system for designing a semiconductor integrated circuit based on a circuit element model, the circuit element model representing a semiconductor element used for circuit simulation of the semiconductor integrated circuit, comprising:
   a calculating unit configured to carry out local process and device simulations for parameters relating to an element structure and a physical model, the element structures and physical models being specified in the semiconductor element, calculate separately electric characteristics of the specified element structures, and classify the calculated electric characteristics according to the bias conditions and element dimensions used in the local process and device simulations.

7. A system for designing a semiconductor integrated circuit based on a circuit element model, the circuit element model representing a semiconductor element used for circuit simulation of the semiconductor integrated circuit, comprising:
   a calculating unit configured to carry out local process and device simulations for parameters relating to an element structure and a physical model, the element structures and physical models being specified in the semiconductor element, calculate separately electric characteristics of the specified element structures, and classify the calculated electric characteristics according to the bias conditions and element dimensions used in the local process and device simulations;
   an optimization unit configured to determine values of the parameters of the circuit element model in a step-by-step manner according to the electric characteristics serving as targets;
   an initial value calculating unit configured to extract physical quantities of the semiconductor element according to results of the local process and device simulations and calculate initial values of the parameters of the circuit element model according to the extracted physical quantities;
   a determination unit configured to determine whether or not the element structures and physical models on which the electric characteristics have been calculated wholly cover the semiconductor element; and
   a designing unit configured to simulate and design the semiconductor integrated circuit according to the parameters of the circuit element model.

8. A method of extracting the parameters of a circuit element model, the circuit element model representing a semiconductor element used for circuit simulation, comprising:

carrying out local process and device simulations for parameters related to element structures and physical models, to calculate separately the electric characteristics of the element structures, the element structures and physical models being specified in the semiconductor element;

classifying the calculated electric characteristics according to bias conditions and element dimensions used in the local process and device simulations; and determining values of the parameters of the circuit element models in a step-by-step manner according to the classified electric characteristics serving as targets.

9. The method of claim 8, wherein:

said determining values of the parameters determines the values of all parameters related to the specified element structures and physical models.

10. A method of extracting the parameters of a circuit element model, the circuit element model representing a semiconductor element used for circuit simulation, comprising:

carrying out local process and device simulations for parameters related to element structures and physical models, to calculate separately the electric characteristics of the element structures, the element structures and physical models being specified in the semiconductor element;

classifying the calculated electric characteristics according to bias conditions and element dimensions used in the local process and device simulations;

determining values of the parameters of the circuit element models in a step-by-step manner according to the classified electric characteristics serving as targets;

extracting physical quantities of the semiconductor element according to the results of the local process and device simulations and calculating initial values of the parameters of the circuit element model according to the extracted physical quantities; and determining whether or not the calculated electric characteristics cover all of the element structures and physical models of the semiconductor element.

11. The method of claim 10, wherein:

the initial values are calculated relating to the film thickness, junction depth, and impurity concentration of the semiconductor element.

12. The method of claim 10, wherein:

said determining whether or not the calculated electric characteristics cover all of the element structures and physical models outputs the determined parameter values if they cover all of the semiconductor elements;

if not, expands the specified element structures or the physical models by adding an additional remaining element structure or an additional remaining physical structure of the semiconductor element to the present element structure and physical model; and carries out local process and device simulations for the expanded element structures or physical models so as to calculate the electric characteristics of the expanded element structures or expanded physical models.

13. The method of claim 10, wherein:

said determining whether or not the calculated electric characteristics cover all of the element structures and physical models outputs the determined parameter values if they wholly cover the semiconductor elements;

if not, expands at least one of the specified element structures and physical models in the semiconductor element; and carries out local process and device simulations for the element structure or the physical model so as to calculate the electric characteristics of the expanded element structure or the physical model.

14. A method of extracting the parameters of a circuit element model, the circuit element model representing a semiconductor element used for circuit simulation, comprising:

carrying out local process and device simulations for parameters related to element structures and physical models, to calculate separately the electric characteristics of the element structures, the element structures and physical models being specified in the semiconductor element;

classifying the calculated electric characteristics according to bias conditions and element dimensions used in the local process and device simulations; and determining values of the parameters of the circuit element models, said values of the parameters relating to a difference between currently inputted and previously inputted electric characteristic calculation conditions in a step-by-step manner according to the classified electric characteristics serving as targets.

15. A computer executable program for extracting parameters used for a circuit simulation, comprising:

specifying element structures and physical models in the semiconductor element;

carrying out local process and device simulations for parameters relating to the specified element structures and physical models, to calculate separately electric characteristics of the specified element structures;

classifying the calculated electric characteristics according to the bias conditions and element dimensions used in the local and device simulations; and determining values of the parameters of the circuit element models in a step-by-step manner according to the classified electric characteristics serving as targets.

* * * * *